(12) United States Patent
Cowley et al.

(10) Patent No.: US 12,225,304 B2
(45) Date of Patent: Feb. 11, 2025

(54) EXPANDED IMAGE SENSOR PIXEL ARRAY

(71) Applicant: SEMICONDUCTOR COMPONENTS INDUSTRIES, LLC, Phoenix, AZ (US)

(72) Inventors: Nicholas Paul Cowley, Wroughton (GB); Andrew David Talbot, Chieveley (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 303 days.

(21) Appl. No.: 17/660,860

(22) Filed: Apr. 27, 2022

(65) Prior Publication Data

US 2023/0353896 A1 Nov. 2, 2023

(51) Int. Cl.
*H04N 25/63* (2023.01)
*H01L 27/146* (2006.01)

(52) U.S. Cl.
CPC ....... *H04N 25/63* (2023.01); *H01L 27/14609* (2013.01); *H01L 27/14636* (2013.01); *H01L 27/14643* (2013.01)

(58) Field of Classification Search
CPC ........ H04N 25/63; H04N 25/75; H04N 25/79; H04N 25/70; H04N 25/78; H04N 25/633; H01L 27/14609; H01L 27/14636; H01L 27/14643; H01L 27/14634
See application file for complete search history.

(56) References Cited

U.S. PATENT DOCUMENTS

| | | | |
|---|---|---|---|
| 9,124,829 B2 * | 9/2015 | Patel | H04N 25/673 |
| 2010/0019130 A1 | 1/2010 | Lee | |
| 2012/0205765 A1 | 8/2012 | Hynecek | |
| 2013/0043373 A1 * | 2/2013 | Asano | H01L 27/14812 250/208.1 |
| 2014/0042298 A1 * | 2/2014 | Wan | H01L 27/1469 257/E31.127 |
| 2014/0055654 A1 | 2/2014 | Borthakur et al. | |
| 2014/0160259 A1 * | 6/2014 | Blanquart | A61B 1/3132 348/65 |
| 2015/0054962 A1 | 2/2015 | Borthakur et al. | |
| 2017/0339327 A1 * | 11/2017 | Koshkin | H04N 23/73 |

* cited by examiner

*Primary Examiner* — Nhan T Tran
(74) *Attorney, Agent, or Firm* — Treyz Law Group, P.C.; Tianyi He

(57) ABSTRACT

An image sensor may be implemented by mounting a first die to a second die. The first die may include an image sensor pixel array having active pixels and non-active pixels, while the second die may include pixel control and readout circuitry that are coupled to the image sensor pixel array via inter-die connections. The image sensor pixel array may have pixel columns in excess of corresponding column readout paths in the pixel readout circuitry and/or pixel rows in excess of corresponding sets of row control paths in the pixel control circuitry. A select set of inter-die connections may be implemented to provide connections between a desired set of pixel columns and the limited number of column readout paths and to provide connections between a desired set of pixel rows and the limited number of sets of row control paths.

20 Claims, 7 Drawing Sheets

EXPANDED IMAGE SENSOR PIXEL ARRAY

BACKGROUND

This relates generally to imaging systems, and more specifically, to image sensors in the imaging systems.

Image sensors are commonly used in electronic systems or devices to generate image data. In a typical arrangement, an image sensor includes an array of image sensor pixels. Based on control signals received along control paths, the image sensor pixel array generates image signals in response to incident light. The generated image signals are read out along readout paths and are used to generate one or more image frames usable in the electronic system.

Different systems or applications may have different requirements for the generated image data (e.g., different noise requirements, different resolution requirements, etc.). It may be desirable to provide an image sensor architecture that forms image sensors meeting different requirements.

It is within this context that the embodiments herein arise.

DETAILED DESCRIPTION

Electronic systems and/or devices may include one or more image sensors that gather incoming light to capture images. The image sensor may include one or more arrays of image sensor pixels. The pixels in the image sensor may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
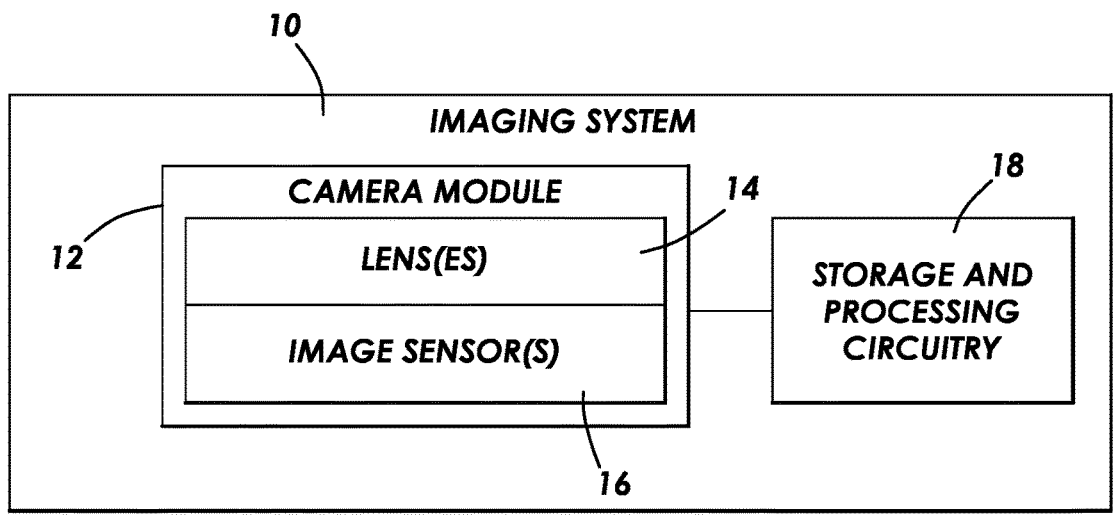
FIG. 1 is a functional block diagram of an illustrative system having one or more image sensors in accordance with some embodiments.

FIG. 1 is a functional block diagram of an illustrative imaging system such as an electronic device that uses an image sensor to capture images. Imaging system 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system (e.g., a drone), an industrial system, or any other desired imaging system or device that captures image data. Camera module 12 (sometimes referred to as an imaging module) may be used to convert incoming light into digital image data. Camera module 12 may include one or more lenses 14 and one or more image sensors 16. During image capture operations, light from a scene may be focused onto each image sensor 16 by one or more lenses 14. Image sensor 16 may include circuitry for converting analog pixel image signals into corresponding digital image data that is provided to storage and processing circuitry 18.

Storage and processing circuitry 18 may include one or more integrated circuits (e.g., image processing circuits, microprocessors, storage devices such as random-access memory and non-volatile memory, etc.) and may be implemented using components that are separate from the camera module and/or components that form part of the camera module (e.g., circuits that form part of an integrated circuit that includes an image sensor 16 or an integrated circuit within the module that is associated with an image sensor 16). When storage and processing circuitry 18 is included on different integrated circuits than those of image sensors 16, the integrated circuits with circuitry 18 may be vertically stacked or packaged with respect to the integrated circuits with image sensors 16. Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, an external display, or other devices) using wired and/or wireless communication paths coupled to processing circuitry 18.

Figure 2:
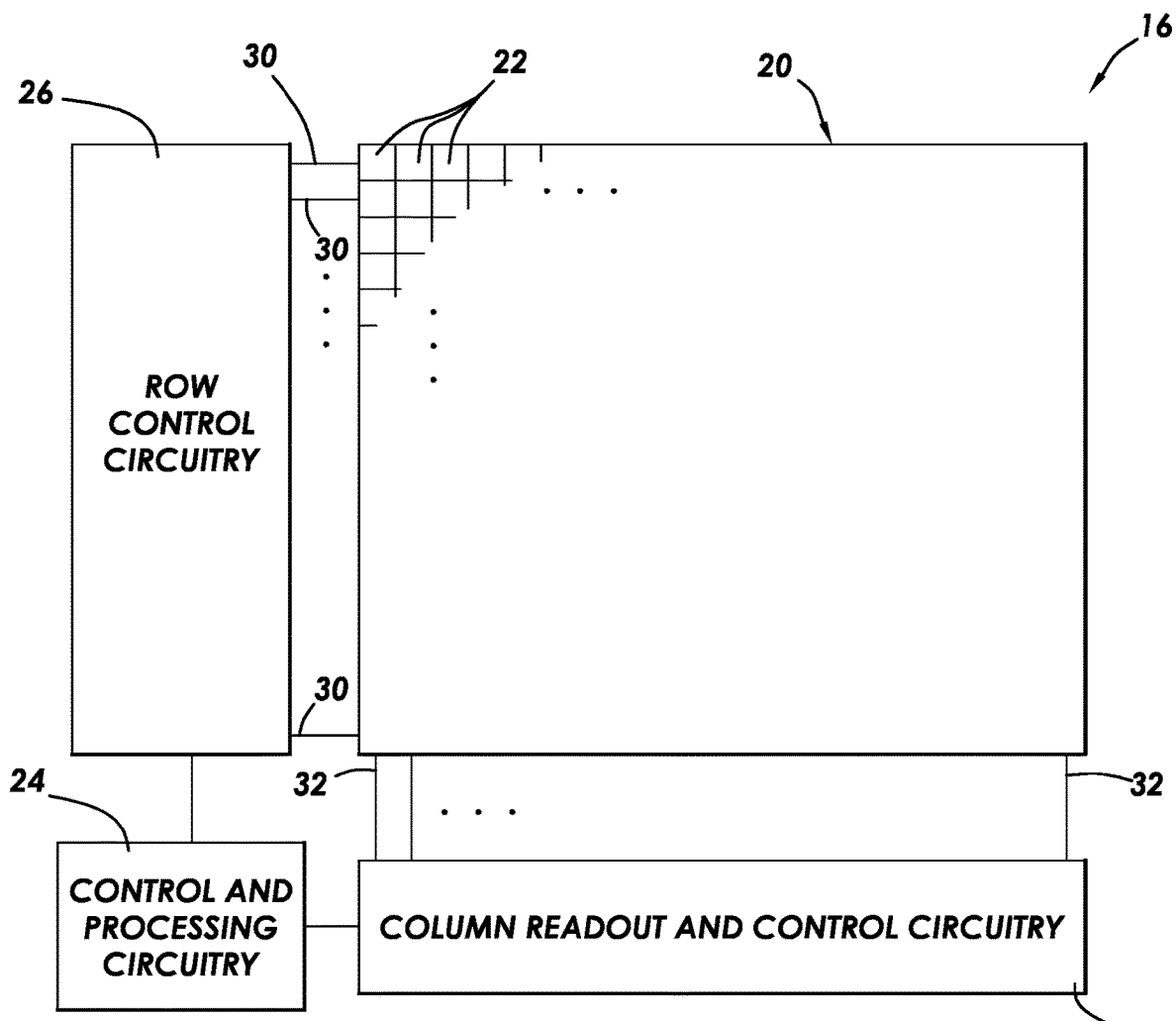
FIG. 2 is a functional block diagram of illustrative image sensor circuitry having an image sensor pixel array and control and readout circuitry for the pixel array in accordance with some embodiments.

As shown in FIG. 2, an image sensor 16 may include a pixel array such as pixel array 20 containing image sensor pixels 22 (sometimes referred to herein as image pixels or pixels) arranged in rows and columns and control and processing circuitry 24 (sometimes referred to herein simply as control circuitry 24). Pixel array 20 may contain, for example, hundreds or thousands of rows and columns of image sensor pixels 22. Control circuitry 24 may be coupled to row control circuitry 26 (e.g., row driver circuitry or row drivers) and column readout and control circuitry 28 (sometimes referred to as column control circuitry, column readout circuitry, image readout circuitry, readout circuitry, or column decoder circuitry).

Row control circuitry 26 may receive row addresses from control circuitry 24 and supply corresponding row control signals such as reset, anti-blooming, row-select, charge transfer, dual conversion gain, and readout control signals to pixels 22 over conductive lines or paths 30 (e.g., pixel row control paths, or simply, control paths). In particular, each pixel row may receive different control signals over a corresponding number of control paths such that each pixel row is coupled to multiple conductive paths 30. One or more conductive lines or paths 32 (e.g., pixel column readout paths, or simply, readout paths) may be coupled to each column of pixels 22. Conductive paths 32 may be used for reading out image signals from pixels 22 and for supplying bias signals (e.g., bias currents or bias voltages) to pixels 22. As an example, during a pixel readout operation, a pixel row in pixel array 20 may be selected using row control circuitry 26 and image signals generated by the selected image pixels 22 in that pixel row can be read out along conductive paths 32.

Column readout circuitry 28 may receive image signals (e.g., analog pixel values generated by pixels 22) over conductive paths 32. Column readout circuitry 28 may include memory or buffer circuitry for temporarily storing calibration signals (e.g., reset level signals, reference level signals) and/or image signals (e.g., image level signals) read out from array 20, amplifier circuitry or a multiplier circuit, analog to digital conversion (ADC) circuitry, bias circuitry, latch circuitry for selectively enabling or disabling portions of column readout circuitry 28, or other circuitry that is coupled to one or more columns of pixels in array 20 for operating pixels 22 and/or for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply digital pixel data from pixels 22 in one or more pixel columns to control and processing circuitry 24 and/or processor 18 (FIG. 1) for further processing and/or storage.

If desired, pixel array 20 may be provided with a filter array having multiple (color) filter elements (each corresponding to a respective pixel) which allows a single image sensor to sample light of different colors or sets of wavelengths.

Image sensor pixels 22 may be formed in a semiconductor substrate using complementary metal-oxide-semiconductor (CMOS) technology or charge-coupled device (CCD) technology or any other suitable photosensitive device technology. Image sensor pixels 22 may be frontside illumination (FSI) image sensor pixels or backside illumination (BSI) image sensor pixels.

Figure 3:
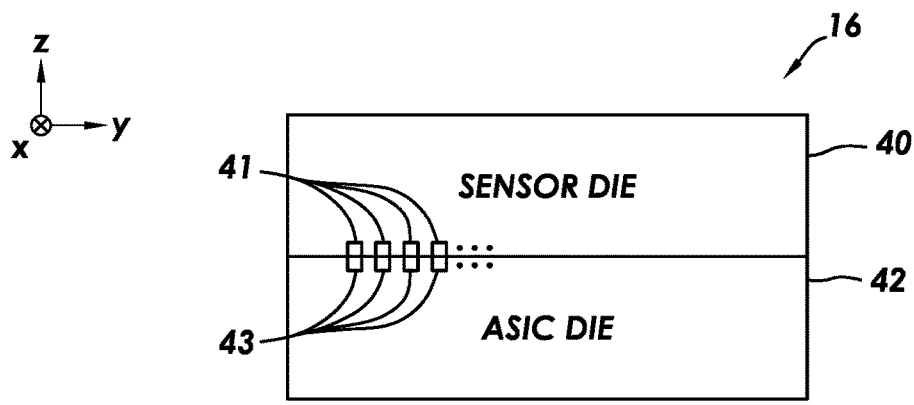
FIG. 3 is a diagram of an illustrative image sensor implemented using stacked integrated circuit dies in accordance with some embodiments.

In some illustrative arrangements described herein as an illustrative example, image sensor 16 may be implemented using an integrated circuit package or other structure in which multiple integrated circuit dies or chips are vertically stacked with respect to each other. FIG. 3 is a diagram illustrating an image sensor 16 implemented by mounting a first die to a second die (e.g., stacking first die 40 on top of second die 42). In the example of FIG. 3, first die 40 is a sensor integrated circuit die and second die 42 is an application-specific integrated circuit (ASIC) die.

In this arrangement, sensor integrated circuit die 40 may implement pixel photosensitive elements such as photodiodes and other image sensor pixel elements such as pixel transistors, floating diffusion regions, capacitors or other analog charge storage elements, etc. ASIC die 40 may implement pixel control circuitry (e.g., circuitry for operating the pixel elements such as driver circuitry configured to provide control signals to pixel transistors), pixel readout circuitry (e.g., circuitry for receiving and processing image signals and other pixel-generated signals from the pixel elements), and other support or peripheral circuitry for supporting the operation of image sensor 16 (e.g., clock circuitry, interface circuitry, power management circuitry, etc.).

Die 40 may be mounted to die 42 in any suitable manner. As one illustrative example, die 40 may be bonded to die 42 at respective bonding surfaces on each die. Conductive interconnect structures 41 at the bonding surface of die 40 may be (electrically) connected to conductive interconnect structure 43 at the bonding surface of die 42. Accordingly, respective inter-die electrical connections may be made through pairs of interconnect structures 41 and 43, thereby facilitating signal conveyance between the two dies. As examples, conductive interconnect structures (e.g., each interconnect structure 41 or 43) may include a die contact pad, a conductive via (connected to the contact pads), one or more signal redistribution vias or layers, one or more metal layers, etc.

In one illustrative arrangement, die 40 may be bonded to die 42 using a hybrid bond process during which conductive structures (e.g., metal interconnect structures 41 and 43) and non-conductive structures (e.g., dielectric material, substrate (semiconducting) material) at respective bonding surfaces of dies 40 and 42 may be fused together. If desired, die 40 may be mounted to die 42 in any other suitable manner (e.g., using wire-bond connections, using flip-chip connections, etc.). If desired, some or all of the mounting and inter-die connection process between dies 40 and 42 may occur at the wafer-to-wafer level, at the die-to-die level, at the die-to-wafer level, etc. Accordingly, depending on how die 40 is mounted to and/or is electrically connected to die 42, intervening connection elements such as solder bumps, micro bumps, copper pillars, etc., may exist between corresponding pairs of interconnect structures 41 and 43. If desired, an additional substrate or interposer may be used to mount die 40 to die 42.

The configuration in which first die 40 implementing pixel circuitry is mounted to second die 42 implementing pixel control and readout circuitry is described herein as an illustrative example. However, the function and separation of elements between sensor integrated circuit die 40 and ASIC die 42 as described above are merely illustrative. If desired, some pixel elements may be implemented outside of die 40 (e.g., on die 42 or on a third die). If desired, the ASIC die functionalities of pixel control, pixel readout, image processing, etc., may be implemented separately on multiple dies instead of being implemented within a single ASIC die 42. While die 42 is sometimes referred to herein as an ASIC die, die 42 and/or any other dies in image sensor 16 may implement its functionalities using any other types of devices (e.g., using field-programmable gate array (FPGA) devices, System-on-Chip (SoC) devices, etc.).

Figure 4:
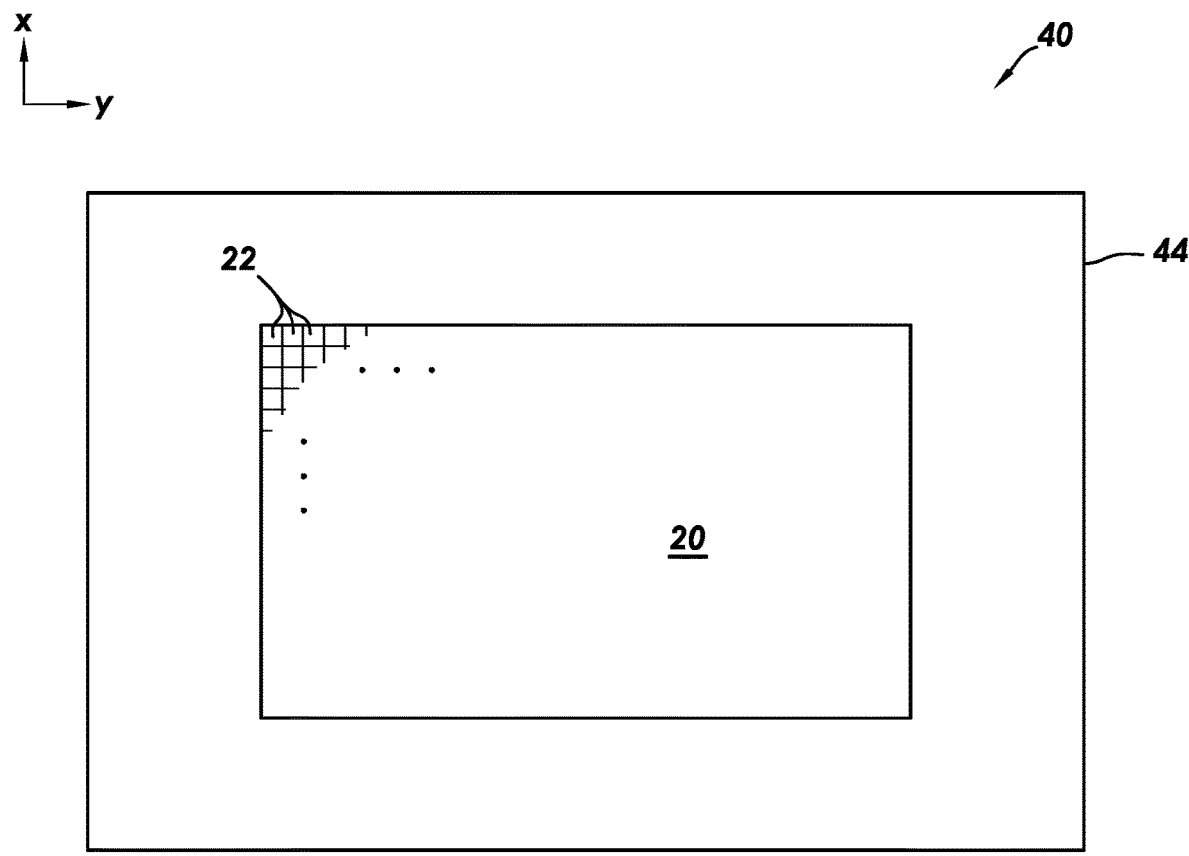
FIG. 4 is a plan view of an illustrative sensor integrated circuit die in accordance with some embodiments.

FIG. 4 is a plan view of a sensor integrated circuit die such as die 40, the peripheral side view of which is shown in FIG. 3. In the example of FIG. 4, integrated circuit die 40 may include a semiconductor substrate such as semiconductor substrate 44 (e.g., a silicon substrate) on which pixels 22 (e.g., pixel elements such as transistors, photodiodes, floating diffusion regions, etc.) are implemented. Pixels 22 may be arranged in columns and rows that collectively form pixel array 20.

Figure 5:
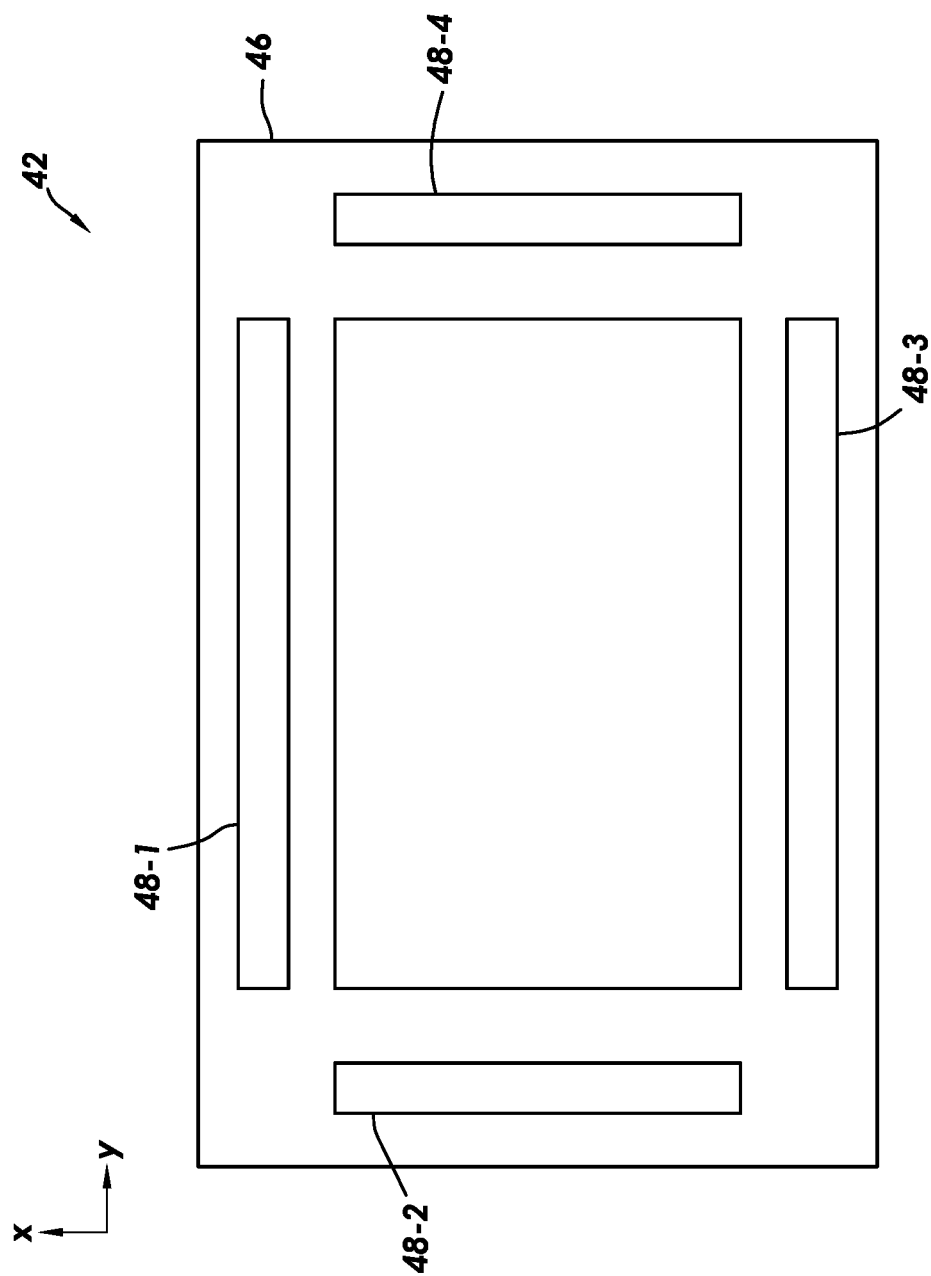
FIG. 5 is a plan view of an illustrative ASIC (application-specific integrated circuit) die in accordance with some embodiments.

FIG. 5 is a plan view of an ASIC die such as die 42, the peripheral side view of which is shown in FIG. 3. In the example of FIG. 5, integrated circuit die 42 may include a semiconductor substrate such as semiconductor substrate 46 (e.g., a silicon substrate) on which circuitry blocks 48 (referring to circuitry blocks 48-1, 48-2, 48-3, and 48-4, collectively) are implemented by fabricating passive and active electrical structures that are interconnected in a suitable manner to achieve one or more dedicated functions.

As shown in FIG. 5, circuitry blocks 48 may be formed along the peripheral edges of substrate 46. Circuitry blocks 48-1 and 48-3 may be formed along the top and bottom peripheral edges of substrate 46 of die 42. Circuitry blocks 48-2 and 48-4 may be formed along the left and right peripheral edges of substrate 46 of die 42. One or more of circuitry blocks 48 may implement pixel control functions (e.g., row control circuitry 26 in FIG. 2), may implement pixel readout functions (e.g., column readout circuitry 28 in FIG. 2), and may implement general timing control and/or signal processing functions (e.g., control and processing circuitry 24 in FIG. 2).

In one illustrative arrangement, circuitry blocks 48-1 and 48-3 may implement at least pixel readout functions (e.g., may form column readout circuitry 28 in FIG. 2). As an example, circuitry block 48-1 may receive pixel output signals from a first set of pixels (e.g., using a first set of columns lines coupled to the first set of pixels arranged in a first set of columns). Circuitry blocks 48-3 may receive pixel output signals from a second set of pixels (e.g., using a second set of column lines coupled to the second set of pixels arranged in a second set of columns). If desired, one of circuitry blocks 48-1 and 48-3 may be omitted, and the other one of circuitry blocks 48-1 and 48-3 may receive all pixel output signals from all of the pixels in the array (e.g., be coupled to all of the column lines).

In one illustrative arrangement, circuitry blocks 48-2 and 48-4 may implement at least pixel control functions (e.g., may form row control circuitry 26 in FIG. 2). As an example, circuitry block 48-2 may provide pixel control signals to a first set of pixels (e.g., using a first set of row lines coupled to the first set of pixels arranged in a first set of rows). Circuitry blocks 48-4 may provide pixel control signals to a second set of pixels (e.g., using a second set of row lines coupled to the second set of pixels arranged in a second set of rows). If desired, one of circuitry blocks 48-2 and 48-4 may be omitted, and the other one of circuitry blocks 48-2 and 48-4 may provide all pixel control signals to all of the pixels in the array (e.g., be coupled to all of the row lines).

If desired, sensor integrated circuit die 40 and ASIC die 42 may be implemented based on stitching (e.g., may each be a stitched die). In particular, one or more stitched dies (e.g., formed using one-dimensional or two-dimensional stitching) may be constructed from a step and repeat exposure process using a small number of tiles, such as four tiles, contained on a single reticle set (e.g., each of the same tile may be exposed at multiple locations across the sensor die).

As an example, a reticle set may include a left-and-right peripheral tile, a top-and-bottom peripheral tile, a corner peripheral tile, and a center tile. Sensor integrated circuit die 40 may implement a pixel array 20 by stitching multiple instances of the center (pixel array) tile to form a pixel array 20. If desired, the center tiles may also form some portions of the pixel control and/or readout circuitry and other functional circuitry (e.g., may include non-pixel circuitry). ASIC die 42 may implement each circuitry block 48-1, 48-2, 48-3, and 48-4 by stitching multiple instances of the left-and-right peripheral tile, and the top-and-bottom peripheral tile and implement other circuitry blocks (e.g., clocking circuitry, power management circuitry, interface circuitry, etc.) by stitching multiple instances of the corner peripheral tile. If desired, the peripheral and corner tiles may also form some portions of the pixel array (e.g., include image sensor pixel circuitry).

If desired, sensor integrated circuit die 40 and ASIC die 42 may be formed using other processes (e.g., one or both of dies 40 and 42 may not be stitched dies).

Figure 6:
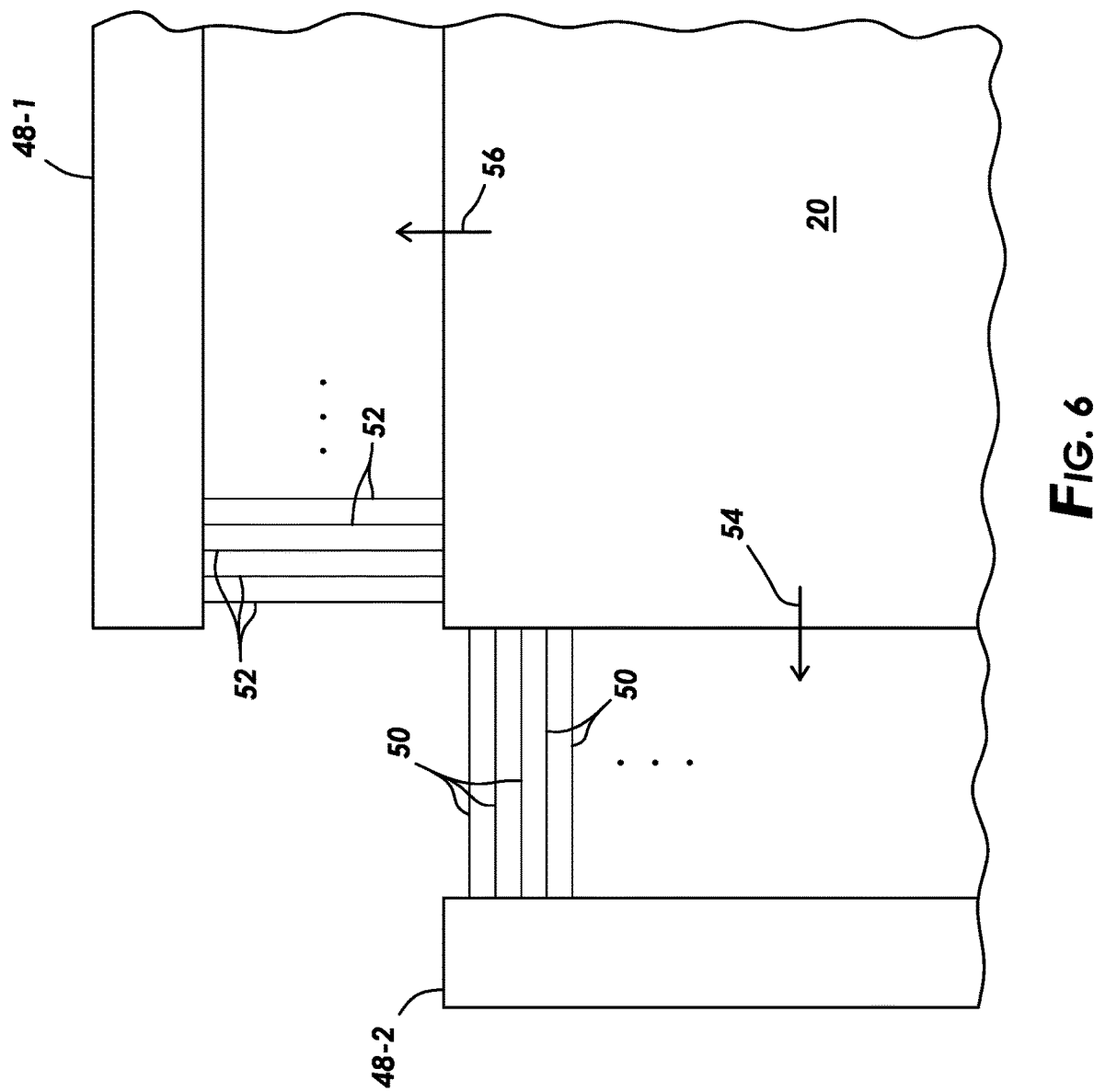
FIG. 6 is a diagram of illustrative connections between a portion of the control and readout circuitry and a portion of an image sensor pixel array in accordance with some embodiments.

FIG. 6 is a diagram of illustrative connections between the pixel control and readout circuitry and the pixel array. In the illustrative example of FIG. 6, pixel control circuitry such as row control circuitry 26 in FIG. 2 may be implemented entirely using a single circuitry block such as circuitry block 48-2 (e.g., a circuitry block along one peripheral edge of die 42 instead of circuitry blocks along both opposing peripheral edges of die 42 as in FIG. 5). Pixel readout circuitry such as column readout circuitry 28 in FIG. 2 may be implemented entirely using a single circuitry block such as circuitry block 48-1 (e.g., a circuitry block along one peripheral edge of die 42 instead of circuitry blocks along both opposing peripheral edges of die 42 as in FIG. 5).

As described in connection with FIGS. 3-5, pixel array 20 on integrated circuit die 40 may be connected to circuitry blocks 48-1 and 48-2 on integrated circuit die 42. Conductive lines 52 (e.g., column lines 32 in FIG. 2) connecting circuitry block 48-1 to columns of pixels in pixel array 20 may be formed from respective conductive interconnect structures on dies 40 and 42 for inter-die connections (e.g., formed from conductive interconnect structures 41 and 43 in FIG. 3 and conductive interconnect structures therebetween, if any). Conductive lines 50 (e.g., row lines 30 in FIG. 2) connecting circuitry block 48-2 to rows of pixels in pixel array 20 may be formed from respective conductive interconnect structures on dies 40 and 42 for inter-die connections (e.g., formed from conductive interconnect structures 41 and 43 in FIG. 3 and conductive interconnect structure therebetween, if any).

Pixel readout circuitry 48-1 (referring to circuitry block 48-1 with pixel readout functions) can include a number of (column) readout paths that match the number of columns in pixel array 20, thereby enabling all pixels in each column to be accessible via a corresponding conductive line 52 coupled to that readout path. Similarly, pixel control circuitry 48-2 (referring to circuitry block 48-2 with pixel control functions) can include a number of (row) driver circuits that match the number of rows in pixel array 20, thereby allowing control of all pixels in each row via a corresponding set of conductive lines 50 for that row.

However, different imaging systems and imaging applications may have different requirements for forming different image sensors (e.g., different noise requirements, different resolution requirements, etc.). The system described above of matching the number of readout paths to the number of columns on the pixel array and matching the number of driver circuits to the number of rows on the pixel array may be inefficient at forming multiple types of image sensors with different characteristics. As an example, based on the above system, one mask set (e.g., one reticle set as described above) for forming an image sensor of a first type with a first pixel resolution cannot be used to form an image sensor of a second type with a second different pixel resolution. As another example, based on the above system, one mask set (e.g., one reticle set as described above) for forming a first type of image sensor configured to provide a first number of buffer/reference pixel signals (e.g., to meeting noise requirements) cannot be used to form a different type of image sensor having different (e.g., higher) noise requirements. As such, different mask (reticle) sets may be required for designing and forming different types of image sensors, thereby increasing complexity and cost.

Figure 7:
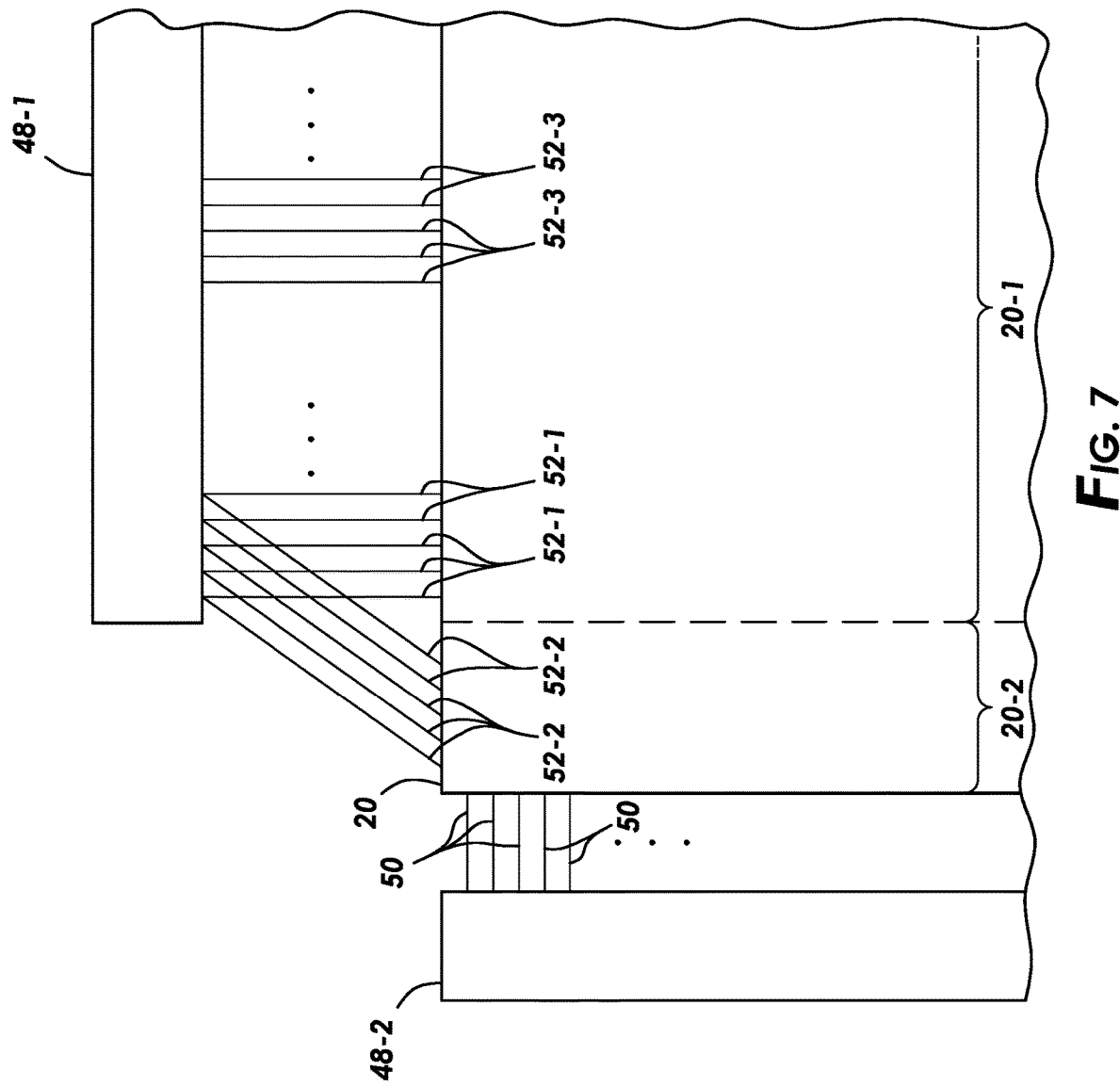
FIG. 7 is a diagram of an illustrative expanded image sensor pixel array and illustrative connections to a portion of the control and readout circuitry in accordance with some embodiments.

To enhance the flexibility of forming different types of image sensors, an image sensor may be designed and formed with an expanded image pixel array having redundant pixels (e.g., using a single mask (reticle) set for forming the expanded image pixel array on sensor integrated circuitry die 40 and the corresponding pixel control and readout circuitry on ASIC die 42). FIG. 7 is a diagram of an illustrative portion of an image sensor having an expanded image sensor pixel array with redundant pixels.

As shown in FIG. 7, pixel array 20 may be expanded in a lateral dimension such that additional columns of pixels are included. In other words, the pixel array of FIG. 6 may be expanded in direction 54 (shown in FIG. 6) to arrive at pixel array 20 in FIG. 7. As such, expanded pixel array 20 includes a first portion 20-1 that has a number of pixel columns matching the number of readout paths on pixel readout circuitry 48-1 and a second expanded portion 20-1 that has an additional number of pixel columns. The pixel rows of expanded pixel array 20 (e.g., in both portions 20-1 and 20-2) may be coupled to pixel control circuitry via corresponding sets of row lines as similarly described in connection with FIG. 6.

Because there are more pixel columns in expanded pixel array 20 than readout paths in pixel readout circuitry 48-1, a number of pixel columns in expanded pixel array 20 may be decoupled from pixel readout circuitry 48-1, thereby causing these decoupled pixels to be redundant due to their signals being unable to be read out. As shown in FIG. 7, two or more different sets of conductive lines (e.g., conductive lines 52-1 and conductive lines 52-1) may be implemented for each readout path in some of the readout paths on pixel readout circuitry 48-1. The formation or implementation of a set of conductive lines may occur while forming the inter-die connections (e.g., structures 41 and 43 in FIG. 3 and additional inter-die structures therebetween, if any).

In a first configuration or implementation of the image sensor, conductive lines 52-1 may be present (e.g., implemented), thereby connecting pixel columns in array portion 20-1 to the set of readout paths on pixel readout circuitry 48-1, while conductive lines 52-2 may be omitted (e.g., may not be implemented or formed as part of the inter-die connection). In other words, in this first configuration, the set of readout paths of pixel readout circuitry 48-1 may access some of the pixel columns of array portion 20-1 via conductive lines 52-1, while some or all of pixel columns of array portion 20-2 are inaccessible by pixel readout circuitry 48-1 (e.g., pixel signals from the pixel columns of array portion 20-2 cannot be received by pixel readout circuitry 48-1).

In a second configuration or implementation of the image sensor, conductive lines 52-2 may be present (e.g., implemented), thereby connecting pixel columns in array portion 20-2 to the set of readout paths on pixel readout circuitry 48-1, while conductive lines 52-1 may be omitted (e.g., may not be implemented or formed as part of the inter-die connection). In other words, in this second configuration, the set of readout paths of pixel readout circuitry 48-1 may access some of the pixel columns of array portion 20-2 via conductive lines 52-2, while some or all of pixel columns of array portion 20-1 are inaccessible by pixel readout circuitry 48-1 (e.g., pixel signals from the pixel columns of array portion 20-1 cannot be received by pixel circuitry 48-1).

Based on the use of an expanded pixel array architecture with redundant pixels, a generic incomplete image sensor may first be formed using a single mask (reticle) set for forming both the sensor integrated circuit die with the expanded pixel array and the ASIC die with corresponding pixel readout and control circuitry. The incomplete image sensor may then be specialized for its desired function or application (e.g., enhance pixel resolution, improved noise performance, etc.) by fabricating a set of inter-die connections (e.g., structures 41 and 43 in FIG. 3 and/or additional inter-die structures therebetween, if any) that implement a desired set of connections to pixel columns of a desired type (e.g., a set of conductive lines 52-1, a set of conductive lines 52-2, a set of conductive lines with a portion being some of conductive lines 52-1 and another portion being some of conductive lines 52-2, etc.). Advantageously, this allows the same mask (reticle) set to be used in fabricating multiple types of image sensor meeting different specifications, thereby at least reducing design and fabrication costs.

The illustrative example above described in connection with FIG. 7 is merely illustrative. If desired, pixel array 20 may be expanded in other lateral directions instead of or in addition to expanding to include additional pixel columns on the left peripheral edge as shown in FIG. 7. As examples, pixel array 20 may be expanded to include additional pixel columns on the right peripheral edge, on the top peripheral edge (in direction 56 as indicated in FIG. 6), and/or on the bottom peripheral edge. In each of these scenarios, supplemental pixel columns and/or supplemental pixel rows may exist to expand the range of characteristics achievable by the resulting image sensor when a selected set of pixel columns are connected to pixel readout circuitry and/or a selected set of pixel rows are connected to pixel control circuitry (e.g., leaving some redundant pixel columns and/or redundant pixel rows unconnected to the corresponding readout and/or control circuitry). The specific characteristics may be finalized using the corresponding inter-die connections to implement the desired row and/or column lines. If desired, multiple sets of inter-die connections (e.g., with intervening switching circuitry) may be made such that the characteristics of the resulting image sensor may be actively changed after fabrication.

If desired, an expanded image pixel array may be implemented in configurations in which control and/or readout circuitry are formed along opposing edges of ASIC die 42 as shown in FIG. 5. In these configurations, the expanded pixel array may have a number of pixel columns greater than the cumulative column readout paths on the readout circuitry along both (top and bottom) edges of ASIC die 42 and/or a number of pixel rows greater than the cumulative sets of control paths on the control circuitry along both (left and right) edges of ASIC die 42.

While illustrated in FIG. 7 to be laterally separated from pixel array 20, circuitry blocks 48-1 and 48-2 (and/or additional circuitry on die 42) may overlap pixel array 20 (e.g., be underneath) pixel array 20) when sensor integrated circuit die 40 is mounted to (e.g., stacked on top of) ASIC die 42. If desired, the pixel array and the circuitry blocks on the stacked image sensor may have any suitable relative positioning insofar as satisfactory inter-die connections can be made (e.g., to implement conductive lines 50 and 52).

As described herein as illustrative examples, characteristics of image sensors may include a pixel resolution, a noise requirement, or other performance metric. Illustrative image sensors having the same base expanded pixel array with different implementations or inter-die connections (e.g., for meeting different pixel resolutions, different noise requirements, etc.) are described in further detail in connection with FIGS. 8 and 9.

Figure 8:
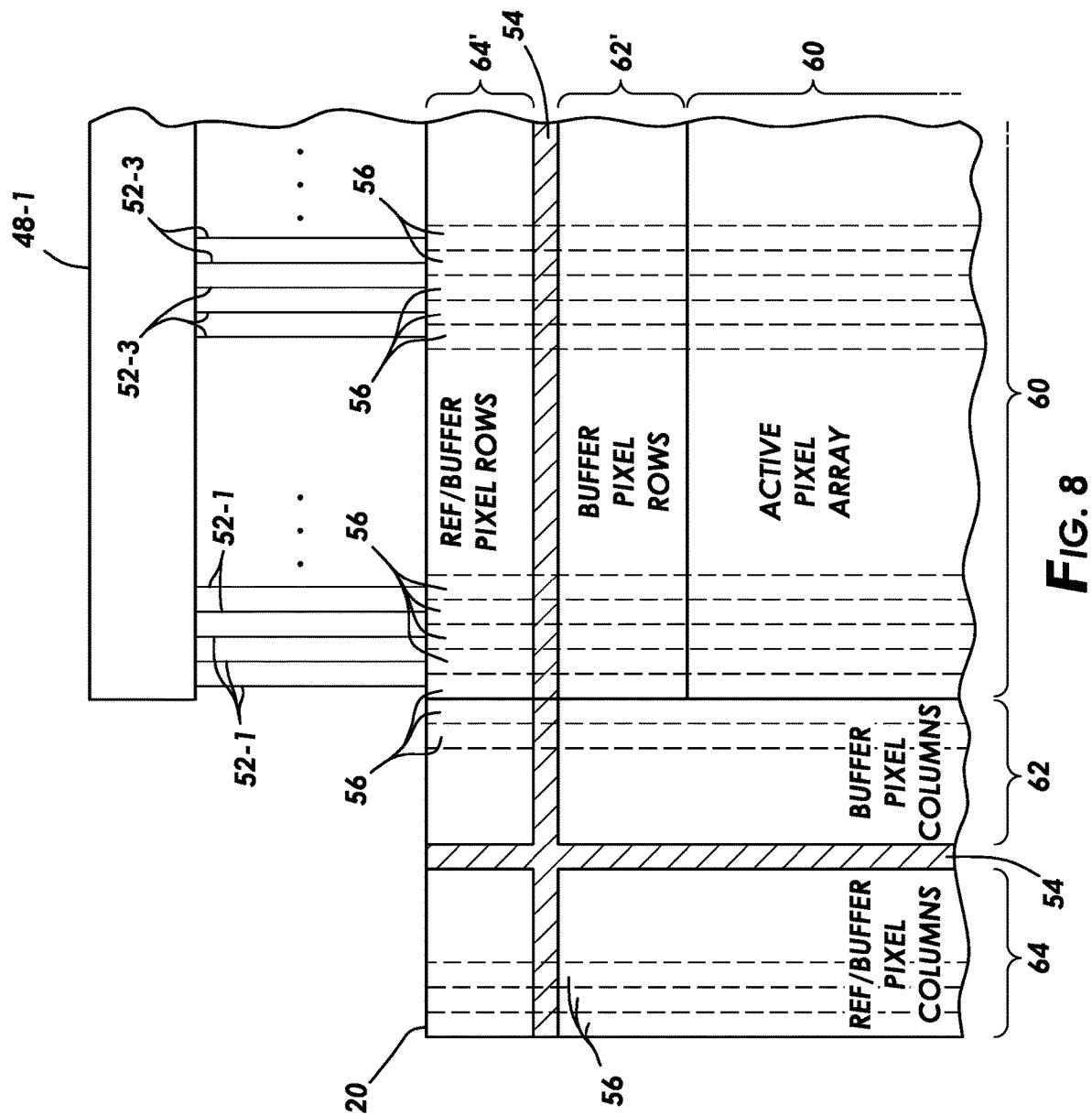
FIG. 8 is a diagram of illustrative connections between a first portion of the expanded image sensor pixel array and a portion of the control and readout circuitry in a first implementation in accordance with some embodiments.

FIG. 8 is a diagram of an illustrative portion of an expanded pixel array connected to the pixel control circuitry in a first implementation. As shown in FIG. 8, a pixel array such as expanded pixel array 20 may include number of different types of pixels: active pixels, buffer pixels, and/or reference pixels. Active pixels are referred to herein as pixels that generate image signals that are representative of the scene(s) imaged (e.g., that generate the image signals in response to incident light from the scene), from which one or more images are constructed. Reference pixels are referred to herein as pixels that generate reference signals that are representative of one or more sources of noise, thereby forming baseline or reference signals useable to denoise the image signals generated by active signals. In some illustrative configurations described herein, reference pixels may include (optically) black pixel that are shielded from the incident light from the scene (e.g., do not receive incident light from the scene). Buffer pixels are referred to herein as pixels that serve as spacers for other pixels (e.g., active pixels, reference pixels, etc.) and/or as pixels that also generate reference signals that are representative of one or more sources of noise, thereby also usable to denoise the image signals. As examples, buffer pixels may exist along edges of an active pixel array portion, along shielding structures, along other non-pixel features in a pixel array, etc. thereby providing separation from active and/or reference pixels. In some illustrative configurations described herein as an example, buffer pixels may include (electrically) black pixels, having photosensitive elements that do not gather and/or accumulate charge in response to incident light, thereby configuring these electrically black pixels to generate additional reference signals indicative of noise levels useable to denoise the image signals. In general, buffer pixels, reference pixels, and/or any other types of non-active pixels may be referred to herein collectively as non-active pixels.

An illustrative top-left corner portion of pixel array 20 is shown in FIG. 8. In particular, pixel array 20 may include a plurality of pixel columns 56. Each pixel column 56 may include N pixels arranged in a vertical line across pixel array 20, N being the number of rows in pixel array 20.

In the illustrative configuration of pixel array 20 in FIG. 8, pixel array 20 may include pixel columns 56 of reference pixels in pixel array portion 64 at or near the peripheral edge of pixel array 20. These reference pixels may include optically black pixels. These optically black pixels may be shielded from incident light on one or more sides using light shielding structures, such as light shielding structures 54, formed from opaque and/or reflective material(s). Light shielding structures 54 may shield these optically black pixels from incident light that would otherwise come through the top and right peripheral edges of array portion 64. Other illustrative light shielding structures may also be employed to shield optically black pixels from incident light coming through other directions. In particular, light shielding structures may overlap the entirety of pixel array portion 64 such that pixel array portion 64 (e.g., optically black pixels in portion 64) are covered (e.g., not visible and therefore does not receive incident light) in a top-down view. The view of pixel array portion 64 in FIG. 8 omits the overlapping light shielding structures, thereby exposing the underlying pixels columns 56 in array portion 64 in order to illustrate the relative position of pixel array portion 64.

While reference pixels are shown to be formed at the peripheral regions of pixel array 20 (e.g., portion 64), active pixels are formed at the central region of pixel array 20 (e.g., active pixel array portion 60). Pixel array 20 may also include pixel columns 56 of buffer pixels in pixel array portion 62 between active pixel array portion 60 and pixel array portion 64. The placement of buffer pixels to surround active pixel array portion 60 may help enhance performance of active pixels (e.g., by minimizing interference from adjacent structures or pixels, by spacing the active pixel array portion 60 from other structures, by providing electrically black pixel reference signals for denoising the image signals, etc.). If desired, one or more buffer pixels may be implemented within pixel portion 64 to achieve similar effects for the reference pixels.

In addition to columns of reference and buffer pixels in array portions 62 and 64 along the left (and right, if desired) peripheral edge(s) of pixel array 20, rows of reference and buffer pixels in pixel array portions 62' and 64' may also be included along the top (and bottom, if desired) peripheral edge(s) of pixel array 20. These rows of reference and buffer pixels may have similar configurations and functions as their column counterparts, and further details of these pixel rows are omitted in order to not obscure the present embodiments.

As described in connection with FIG. 7 (and in connection with column readout circuitry 28 in FIG. 2), pixel readout circuitry 48-1, which implements one or more portions of readout circuitry 28 in FIG. 2, may include a number of parallel (column) readout paths. Each readout path in pixel readout circuitry 48-1 may couple a corresponding conductive line 52 (e.g., a corresponding column line 32) to a corresponding readout circuit for that conductive line. Each readout circuit in pixel readout circuitry 48-1 may include one or more of memory or buffer circuitry for temporarily storing calibration signals (e.g., reset level signals, reference level signals) and/or image signals (e.g., image level signals), amplifier circuitry or a multiplier circuit, analog to digital conversion (ADC) circuitry, bias circuitry, latch circuitry for selectively enabling or disabling portions of pixel readout circuitry 48-1, or other circuitry. If desired, multiple parallel readout paths in pixel readout circuitry 48-1 may be coupled to one or more shared readout circuits (e.g., buffer circuitry shared between multiple columns, amplifier circuitry shared between multiple pixel columns, ADC circuitry shared between multiple columns, etc.).

With the use of an expanded pixel array such as pixel array 20 in FIG. 8, there may be more pixel columns 56 in pixel array 20 than pixel readout paths in pixel readout circuitry 48-1. In other words, pixel array 20 may include X number of columns of pixels, while pixel readout circuitry 48-1 includes Y number of readout paths, Y being less than X. Accordingly, only Y number of columns of pixels may be coupled to pixel readout circuitry 48-1 and available for readout, while the remaining pixel columns are redundant.

In the illustrative configuration of FIG. 8, pixel readout circuitry 48-1 may be coupled to each column of active pixel array portion 60 such that all active pixels are accessible by at least one column line and therefore at least readable through one readout path in pixel readout circuitry 48-1. In particular, conductive lines 52-1 and 52-3 may couple each column of active pixels to a correspond readout path in pixel readout circuitry 48-1. Conductive lines 52-3 may be indicative of column lines having a fixed implementation (e.g., always implemented to connect a subset of active pixel array columns to pixel readout circuitry 48-1). Conductive lines 52-1 may be indicative of column lines having a flexible implementation (e.g., can be implemented to connect different sets of pixel columns to the same readout paths in pixel readout circuitry 48-1 depending on the implementation inter-die connections).

In the illustrative implementation shown in FIG. 8, conductive lines 52-1 are implemented to connect active pixel array columns to the readout paths in pixel readout circuitry 48-1. In this illustrative implementation, buffer and reference pixel columns in pixel array portion 62 and 64 may be decoupled from (e.g., disconnected from, inaccessible from, not connected to, etc.) any readout paths in pixel readout circuitry 48-1. In other words, signals (if generated) from pixels in pixel array portion 62 and/or 64 may not be accessible or readable by pixel readout circuitry 48-1 (or any other readout circuitry).

Figure 9:
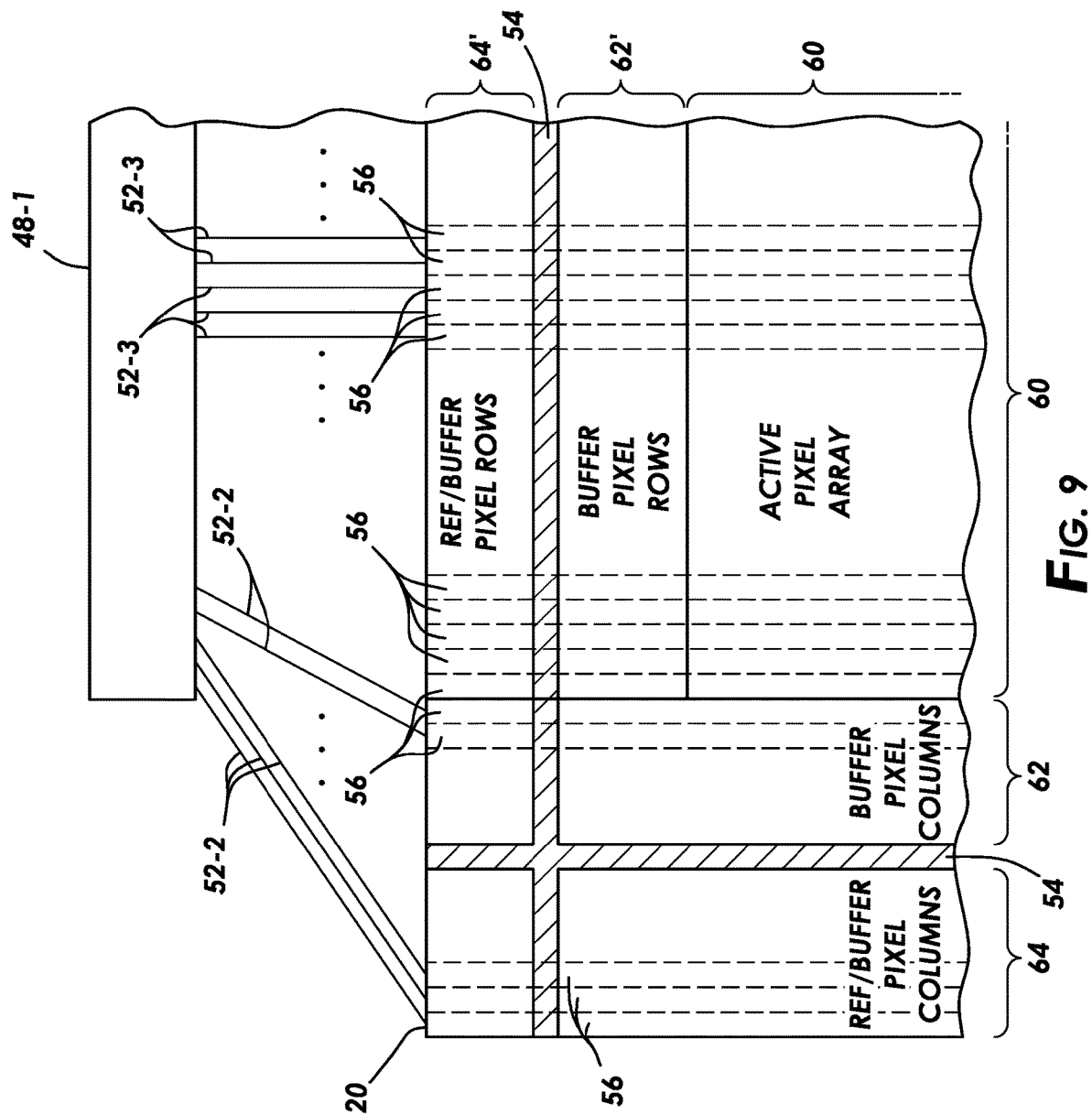
FIG. 9 is a diagram of illustrative connections between a second portion of the expanded image sensor pixel array and a portion of the control and readout circuitry in a second implementation in accordance with some embodiments.

FIG. 9 is a diagram of an illustrative portion (the same portion as in FIG. 8) of an expanded pixel array connected to the pixel control circuitry in a second implementation. In contrast with the implementation of FIG. 8, conductive lines 52-2 in FIG. 9 may be implemented instead of conductive lines 52-1 in FIG. 8. In other words, instead of providing conductive lines (e.g., column lines) for accessing each column of active pixel array portion 60, access to a set of active pixel array columns may be omitted, while access to a remaining set of active pixel array columns is still provided via conductive lines 52-3. In the absence of any conductive lines coupling the set of active pixel array columns to any readout paths in pixel readout circuitry 48-1, the set of active pixel array columns may be decoupled from pixel readout circuitry 48-1. By using conductive lines 52-2, some readout paths in pixel readout circuitry 48-1 may be coupled to (some or all) reference and/or buffer pixel columns in pixel array portions 62 and/or 64.

Because pixel resolution is determined by the dimensions of the active pixels, by enabling access to each active pixel as described in connection with FIG. 8 via corresponding columns lines, an image sensor implementing the configuration of FIG. 8 may have an improved pixel resolution relative to an image sensor implementing the configuration of FIG. 9, which effectively decreases the number of usable active pixels. On the other hand, by enabling access to reference and buffer pixels as described in connection with FIG. 9 via corresponding column lines, an image sensor implementing the configuration of FIG. 9 may have improved noise performance relative to an image sensor implementing the configuration of FIG. 8 which effectively decreases denoising capabilities (e.g., by not generating or decreases the amount of generated reference data available for denoising).

The illustrative examples provided in connection with FIGS. 8 and 9 are merely illustrative and provide only two possibilities for sets of column line connections (e.g., one for connecting to all active pixels, one for connecting to all reference and/or buffer pixels and a subset of all active pixels). If desired, any suitable combination of connections to reference pixel columns, buffer pixel columns, and/or active pixel columns may be made from the limited number of readout paths on the pixel readout circuitry.

Details of the pixel control circuitry are omitted from FIGS. 8 and 9 in order to not unnecessarily obscure the embodiments. If desired, the pixel control circuitry as described in connection with FIGS. 5-7 may be employed in the implementation of pixel readout circuitry as detailed in FIGS. 8 and 9.

As described above in connection with FIG. 7, supplemental (expanded) pixel rows may be provided instead of or in addition to supplemental (expanded) pixel columns (as detailed in connection with FIGS. 8 and 9). If desired, the description in connection with FIGS. 8 and 9 may be analogously applied to the supplemental pixel row arrangement (e.g., by considering a configuration in which circuitry block 48-1 is replaced by circuitry block 48-2, pixel columns are replaced with pixel rows and vice versa, each conductive column line 52 is replaced with a corresponding set of conductive row lines 50, etc.).

Various embodiments have been described illustrating image sensors with an expanded image sensor pixel array.

As an example, an image sensor may include an array of image sensor pixels implemented on a first integrated circuit die. The image sensor pixels may include active pixels and non-active pixels (e.g., reference pixels such as optically black pixels, buffer pixels such as electrically black pixels, etc.). The image sensor may further include a circuitry block coupled to the array of image sensor pixels via a set of parallel conductive lines, each conductive line being coupled to a corresponding set of image sensor pixels in the array of image sensor pixels, where the circuitry block is implemented on a second integrated circuit die mounted to the first integrated circuit die. The first and second integrated circuit dies include respective interconnect structures for forming inter-die connections, and the parallel conductive lines may be implemented using the inter-die connections.

The array of image sensor pixels may include a set of redundant pixels that are decoupled from the circuitry block. Inter-die connections for this set of redundant pixels may at least be partly absent (to form one or more open circuits or missing connections that decouple the set of redundant pixels from the circuitry block). The decoupled set of redundant pixels may include active pixels or non-active pixels.

In one illustrative arrangement, the circuitry block may implement pixel readout circuitry. In this arrangement, the conductive lines may be column lines, the set of pixels may be columns of pixels, and the set of redundant pixels may be columns of redundant pixels.

In one illustrative arrangement, the circuitry block (or an additional circuitry block) may implement pixel control circuitry. In this arrangement, the conductive lines may be row lines, the set of pixels may be rows of pixels, and the set of redundant pixels may be rows of redundant pixels.

If desired, the active pixels may be arranged in a central portion of the image sensor pixel array, and the non-active pixels may be arranged in a peripheral portion of the image sensor pixel array. If desired, the first integrated circuit die and the second integrated circuit die may be implemented as stitched dies (e.g., by stitching together multiple instances of one or more tiles).

The foregoing embodiments may be implemented individually or in any combination. It will be recognized by one of ordinary skill in the art, that the present exemplary embodiments may be practiced without some or all of the corresponding specific details. In some instances, well-known operations have not been described in detail in order not to unnecessarily obscure the embodiments described herein. The foregoing is merely illustrative of the principles of this invention and various modifications can be made by those skilled in the art without departing from the scope and spirit of the invention.

What is claimed is:
1. An image sensor comprising:
a first integrated circuit die including an image sensor pixel array having active pixels and non-active pixels arranged in a number of pixel columns; and
a second integrated circuit die mounted to the first integrated circuit die, the second integrated circuit die including pixel readout circuitry having a number of readout paths fewer than the number of pixel columns, wherein a first set of the pixel columns in the image sensor pixel array are coupled to the readout paths in the pixel readout circuitry via column lines, the first set of pixel columns including first non-active pixels coupled to at least some of the readout paths in the pixel readout circuitry, and wherein a second set of the pixel columns in the image sensor pixel array are decoupled from the pixel readout circuitry, the second set of pixel columns including second non-active pixels decoupled from the pixel readout circuitry.

2. The image sensor defined in claim 1, wherein the first and second integrated circuit dies include respective interconnect structures for forming inter-die connections, and the column lines are implemented using the inter-die connections.

3. The image sensor defined in claim 2, wherein inter-die connections for the second set of the pixel columns are at least partly absent.

4. The image sensor defined in claim 1, wherein the non-active pixels in the image sensor pixel array comprise an optically black pixel configured to generate a reference signal indicative of a noise level.

5. The image sensor defined in claim 1, wherein the first non-active pixels include an optically black pixel.

6. The image sensor defined in claim 1, wherein the second non-active pixels include an optically black pixel.

7. The image sensor defined in claim 1, wherein the non-active pixels in the image sensor pixel array comprise an electrically black pixel configured to generate a reference signal indicative of a noise level.

8. The image sensor defined in claim 1, wherein the first non-active pixels include an electrically black pixel.

9. The image sensor defined in claim 1, wherein the second non-active pixels include an electrically black pixel.

10. The image sensor defined in claim 1, wherein the active pixels are arranged in a central portion of the image sensor pixel array, and the non-active pixels are arranged in a peripheral portion of the image sensor pixel array.

11. The image sensor defined in claim 10, wherein the second set of the pixel columns comprises the active pixels in the central portion of the image sensor pixel array.

12. The image sensor defined in claim 10, wherein the first set of the pixel columns comprises the active pixels in the central portion of the image sensor pixel array.

13. The image sensor defined in claim 1, wherein the first integrated circuit die and the second integrated circuit die are implemented as stitched dies.

14. The image sensor defined in claim 1, wherein the first non-active pixels comprise first buffer pixels and first reference pixels and wherein the second non-active pixels comprise second buffer pixels and second reference pixels.

15. An image sensor comprising:
a first integrated circuit die including an image sensor pixel array having active pixels and non-active pixels arranged in a number of pixel rows; and
a second integrated circuit die mounted to the first integrated circuit die, the second integrated circuit die including pixel control circuitry having a number of sets of control paths fewer than the number of pixel rows, wherein a first set of the pixel rows in the image sensor pixel array are coupled to the set of control paths in the pixel control circuitry via row lines and a second set of the pixel rows in the image sensor pixel array are decoupled from the pixel control circuitry, wherein the first integrated circuit die is a stitched die constructed by a step and repeat exposure process using a reticle set.

16. The image sensor defined in claim 15, wherein the first and second integrated circuit dies include respective interconnect structures for forming inter-die connections, and the row lines are implemented using the inter-die connections.

17. The image sensor defined in claim 16, wherein inter-die connections for the second set of the pixel rows are at least partly absent.

18. An image sensor comprising:
an array of image sensor pixels; and
a circuitry block coupled to the array of image sensor pixels via a set of parallel conductive lines, each conductive line being coupled to a corresponding set of image sensor pixels in the array of image sensor pixels, wherein the array of image sensor pixels includes a set of redundant pixels that are decoupled from the circuitry block and wherein the set of redundant pixels comprises active pixels.

19. The image sensor defined in claim 18, wherein the array of image sensor pixels is implemented on a first integrated circuit die, and the circuitry block is implemented on a second integrated circuit die mounted to the first integrated circuit die.

20. The image sensor defined in claim 19, wherein the set of redundant pixels comprises non-active pixels.

* * * * *